US010672498B2

(12) United States Patent
Kim (10) Patent No.: US 10,672,498 B2
(45) Date of Patent: Jun. 2, 2020

(54) REPAIR DEVICE AND SEMICONDUCTOR DEVICE INCLUDING THE SAME

(71) Applicant: SK hynix Inc., Gyeonggi-do (KR)

(72) Inventor: Jong Sam Kim, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/887,552

(22) Filed: Feb. 2, 2018

(65) Prior Publication Data

US 2019/0051371 A1    Feb. 14, 2019

(30) Foreign Application Priority Data

Aug. 11, 2017   (KR) .................. 10-2017-0102266

(51) Int. Cl.
*G11C 29/44* (2006.01)
*G11C 29/38* (2006.01)
*G11C 29/12* (2006.01)

(52) U.S. Cl.
CPC .... *G11C 29/4401* (2013.01); *G11C 29/12015* (2013.01); *G11C 29/38* (2013.01); *G11C 2029/4402* (2013.01)

(58) Field of Classification Search
CPC .......... G11C 29/4401; G11C 29/12015; G11C 29/38; G11C 2029/4402; G11C 29/44; G11C 17/16
See application file for complete search history.

(56) References Cited

U.S. PATENT DOCUMENTS

| 6,055,197 | A  | * | 4/2000 | Kato | ................... | G11C 29/808 |
| | | | | | | 365/189.07 |
| 8,422,323 | B2 | * | 4/2013 | Yang | ..................... | G11C 29/28 |
| | | | | | | 365/191 |
| 9,123,395 | B2 | * | 9/2015 | Kwak | .................... | G11C 5/025 |
| 9,362,008 | B2 | | 6/2016 | Yang et al. | | |
| 2003/0036226 | A1 | * | 2/2003 | Morgan | ............... | G11C 29/812 |
| | | | | | | 438/200 |
| 2008/0028260 | A1 | * | 1/2008 | Oyagi | .................. | G11C 29/808 |
| | | | | | | 714/6.1 |
| 2015/0310926 | A1 | | 10/2015 | Akamatsu | | |
| 2016/0180969 | A1 | * | 6/2016 | Noh | ....................... | G11C 29/78 |
| | | | | | | 365/96 |
| 2017/0256326 | A1 | * | 9/2017 | You | ..................... | G06F 11/0727 |
| 2018/0261297 | A1 | * | 9/2018 | Kim | ........................ | G11C 29/84 |
| 2018/0308563 | A1 | * | 10/2018 | You | ..................... | G11C 29/4401 |
| 2018/0330798 | A1 | * | 11/2018 | You | ...................... | G06F 11/1048 |

* cited by examiner

*Primary Examiner* — Khamdan N. Alrobaie
(74) *Attorney, Agent, or Firm* — IP & T Group LLP (57) ABSTRACT

A repair device and a semiconductor device including the same are disclosed, which relate to a technology for a Post Package Repair (PPR) device. The repair device includes: a clock generator configured to generate a fuse clock signal based to corresponding to an available fuse; a fuse selection circuit configured to discriminate between a first clock signal and a second clock signal in the fuse clock signal; a fuse signal generator configured to output a first repair signal corresponding to the first clock signal and a second repair signal corresponding to the second clock signal during a post package repair (PPR) mode; and an output circuit configured to output a first output signal by detecting address information of the remaining unused fuses in response to the first repair signal, or configured to output a second output signal by detecting address information of the remaining unused fuses.

20 Claims, 8 Drawing Sheets

REPAIR DEVICE AND SEMICONDUCTOR DEVICE INCLUDING THE SAME

CROSS-REFERENCE TO RELATED APPLICATION

This application claims priority based upon Korean patent application No. 10-2017-0102266, filed on Aug. 11, 2017, the disclosure of which is hereby incorporated in its entirety by reference herein.

BACKGROUND

1. Technical Field

Embodiments of the present disclosure may generally relate to a repair device and a semiconductor device including the same, and more particularly to a technology for a Post Package Repair (PPR) device.

2. Related Art

When defect or error occurs in at least one of a plurality of memory cells, the semiconductor memory device having the defective memory cell is discarded as a defective product. As more semiconductor memory devices are being developed to a higher degree of integration at a higher speed, there is more possibility that the semiconductor device has defective memory cells. In view of cost and productivity, it is inefficient to discard the whole semiconductor memory device because of a few defective memory cells in the semiconductor memory device that causes a lowered production yield of a semiconductor memory device.

Therefore, in order to increase a production yield of semiconductor memory devices, many developers and companies are conducting intensive research into a method for efficiently repairing defective cells of semiconductor memory devices.

Generally, the semiconductor memory device includes a redundancy memory cell. When defective or failed memory cells occur after completion of such packaging, the defective memory cells are replaced with redundancy memory cells, which repairs the semiconductor memory device. A method for replacing defective memory cells with redundancy memory cells after completion of a test in the packaged state is referred to as a post package repair (PPR).

The PPR technology can repair defective memory cells that are not discovered in a wafer state and generated after packaging completion, using an electrical fuse (e.g., array E-fuse: ARE), such that package productivity can increase through the PPR process.

SUMMARY

Various embodiments of the present disclosure are directed to providing a repair device and a semiconductor device including the same that substantially obviate one or more problems due to limitations and disadvantages of the related art.

The embodiment of the present disclosure relates to a technology for divisionally using a fuse region and outputting information regarding available fuses during a PPR process such that the available fuses can normally operate during the PPR process.

In accordance with an embodiment of the present disclosure, a repair device comprising: a clock generator configured to generate a fuse clock signal corresponding to an available fuse based to a fuse signal indicating whether a fuse is used or not; a fuse selection circuit configured to discriminate between a first clock signal and a second clock signal in the fuse clock signal in response to a first signal and a second signal; a fuse repair signal generator configured to output a first repair signal corresponding to the first clock signal and a second repair signal corresponding to the second clock signal during a post package repair (PPR) mode; and an output circuit configured to output a first output signal by detecting address information of the remaining unused fuses in response to the first repair signal, or configured to output a second output signal by detecting address information of the remaining unused fuses in response to the second repair signal.

In accordance with another embodiment of the present disclosure, a semiconductor memory device includes: a memory cell array including first and second memory cell regions; and a repair device including a fuse array including first and second fuse groups, which respectively correspond to the first and second memory cell regions, and configured to control the memory cell array to perform a repair operation alternately to the first and second memory cell regions by using the fuse array in a post package repair (PPR) mode.

In accordance with another embodiment of the present disclosure, a repair device comprising: a fuse array including first and second fuse groups for a repair operation in a post package repair (PPR) mode, and configured to generate a fuse signal, toggles of which indicate corresponding fuses in use therein; a clock generator configured to generate a fuse clock signal, each toggle of which corresponds to an available fuse in the fuse array, based on the fuse signal; a failed region detection circuit configured to generate first and second signals respectively indicating first and second memory cell regions of a memory cell array according to a failed address of the repair target memory cell in the memory cell array; a fuse selection circuit configured to generate first and second clock signals, which respectively correspond to the first and second fuse groups, from the fuse clock signal in response to the first and second signal; a repair signal generator configured to output first and second repair signals from the first and second clock signals, respectively; and an output circuit configured to detect the available fuse in the respective first and second fuse groups, and output first and second output signals according to the first and second repair signals.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features and advantages of the present disclosure will become readily apparent by reference to the following detailed description when considered in conjunction with the accompanying drawings wherein.

DETAILED DESCRIPTION

Reference will now be made in detail to embodiments of the present disclosure, examples of which are illustrated in the accompanying drawings. Wherever possible, the same reference numbers are used throughout the drawings to refer to the same or like portions.

A semiconductor memory device may include a plurality of normal memory cell arrays and a redundancy memory cell array including repair memory cells. Ideally, although it is preferable that all memory cells contained in each normal memory cell array of the semiconductor memory device can normally operate, the normal memory cell array may include defective memory cells due to a fabrication process or electrical characteristics of the semiconductor memory device. When a defective cell is discovered in the normal memory cell, the semiconductor memory device may be replaced with a repair memory cell.

After completion of a wafer fabrication process of the semiconductor memory device, a test for deciding whether memory cells are in a normal or abnormal state is conducted. If a defective memory cell is discovered during the test, the defective memory cell is replaced with a repair memory cell in the semiconductor memory device through a repair operation.

The operation for repairing one or more defective cells of the semiconductor memory device may be classified into a first repair operation to be performed in a wafer state and a second repair operation to be performed in a package state. The second repair operation to be performed in the package state will hereinafter be referred to as a post package repair (PPR) operation.

The semiconductor memory device may include a fuse circuit capable of programming a repair target address corresponding to a repair target memory cell or a defective cell.

As a result of the repair operation, when an attempt to access the repair target memory cell occurs, the redundancy memory cell may be accessed through the programmed repair target address.

On the other hand, the semiconductor memory device may require a refresh operation for recharging data stored in each memory cell to prevent data loss in the memory cell. Only a specific bank from a plurality of banks must operate in a PPR mode, and the remaining banks must perform a refresh operation to preserve the stored data.

Generally, the semiconductor memory device performs the refresh operation by enabling only one word line at one time. In order to improve refresh characteristics, the semiconductor memory device may also perform the refresh operation by enabling a plurality of word lines at one time. However, assuming that a fuse allocated through a conventional method is used in the PPR operation, the fuse may operate abnormally.

The embodiments of the present disclosure may selectively use a fuse region among a plurality of fuse regions allocated for a Hard-Post Package Repair (HPPR) in the semiconductor memory device designed to perform the refresh operation by enabling several word lines at one time, such that the fuse can operate normally in the semiconductor memory device.

Figure 1:
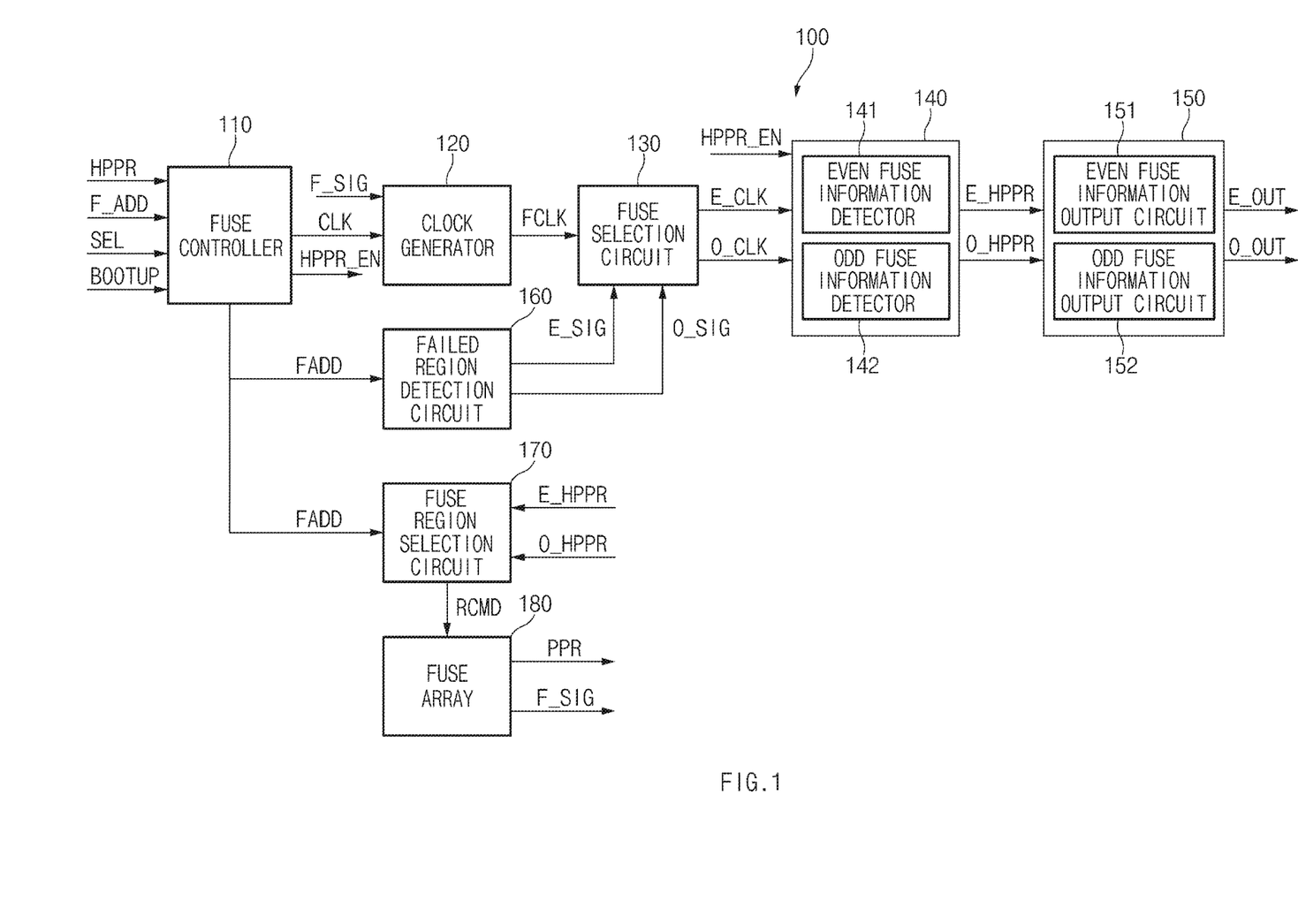
FIG. 1 is a block diagram illustrating a repair device according to an embodiment of the present disclosure.

FIG. 1 is a block diagram illustrating a repair device 100 according to an embodiment of the present disclosure.

Referring to FIG. 1, the repair device 100 may include a fuse controller 110, a clock generator 120, a fuse selection circuit 130, a repair signal generator 140, an output circuit 150, a failed region detection circuit 160, a fuse region selection circuit 170, and a fuse array 180.

The fuse controller 110 may generate a clock signal CLK periodically enabled when a boot-up signal BOOTUP is enabled. The boot-up signal BOOTUP may be enabled during a power-up operation in an initialization mode of the semiconductor memory device.

The semiconductor memory device may operate in a PPR mode so as to properly cope with a defect or failure after the semiconductor memory device is packaged. The PPR mode may be classified as either a hard-PPR (HPPR) mode or a soft-PPR (SPPR) mode.

In the HPPR mode, a repair target memory cell may be permanently repaired through permanent storage of a repair target address in the fuse array 180 during the repair operation. As a result of the permanent storage of the repair target address, a boot-up operation may be performed whenever the semiconductor memory device is powered up.

In the SPPR mode, a repair target memory cell may be temporarily repaired through latch (i.e., temporary storage) of a repair target address in a register or latch circuit while the semiconductor memory device remains powered on. As a result of the temporary storage of the repair target address, a repair operation may be performed on the repair target memory cell whenever the semiconductor memory device is powered up.

The fuse controller 110 may output an HPPR enable signal HPPR_EN in response to an HPPR signal HPPR, an input address F_ADD, and a mode selection signal SEL.

The HPPR signal HPPR may indicate whether the PPR is an HPPR operation mode or an SPPR operation mode. The HPPR signal HPPR may be established through a mode register set (MRS). For example, the HPPR signal HPPR may be enabled to a logic high level, which sets the HPPR enable signal HPPR_EN as enabled. The input address F_ADD may be the above-described repair target address.

The mode selection signal SEL may indicate whether it is an entire mode or a partial mode. In the entire mode, a fuse region allocated for the repair operation may be entirely used. In the partial mode, the fuse region may be divided into a plurality of sub fuse regions and selectively one among the divided sub fuse regions may be used. For example, if the repair device 100 performs the refresh operation in units of 8K, the mode selection signal SEL is set to have a logic low level such that the whole fuse region may be used. In contrast, if the repair device 100 performs the refresh operation in units of 4K, the mode selection signal SEL is set to have a logic high level, such that the divided sub fuse regions of the fuse region may be selectively used.

The clock generator 120 may generate a fuse clock signal FCLK in response to the clock signal CLK. The fuse clock signal FCLK may toggle depending on a fuse signal F_SIG. The toggles represent corresponding fuses in use in the fuse array 180. If the clock signal CLK is activated during the re-bootup operation, the fuse clock signal FCLK is changed in response to the fuse signal F_SIG such that available fuse information is updated. The clock generator 120 may detect an available fuse based on the fuse signal F_SIG, and may thus generate the fuse clock signal FCLK indicating the available fuse in the fuse array 180.

The fuse selection circuit 130 may generate a first clock signal E_CLK and a second clock signal O_CLK in response to a first signal E_SIG and a second signal O_SIG. For convenience of description and better understanding of the present disclosure, the first signal E_SIG will hereinafter be referred to as an even signal, the second signal O_SIG will hereinafter be referred to as an odd signal, the first clock signal E_CLK will hereinafter be referred to as an even clock signal, and the second clock signal O_CLK will hereinafter be referred to as an odd clock signal.

For example, the fuse selection circuit 130 may generate the even clock signal E_CLK synchronized with an even clock of the fuse clock signal FCLK while the even signal E_SIG is enabled. In contrast, the fuse selection circuit 130 may generate the odd clock signal O_CLK synchronized with an odd clock of the fuse clock signal FCLK while the odd signal O_SIG is enabled.

The repair signal generator 140 may output a first repair signal E_HPPR or a second repair signal O_HPPR in response to the HPPR enable signal HPPR_EN. The HPPR enable signal HPPR_EN is enabled to a high level when the repair device 100 enters the HPPR mode. For convenience of description and better understanding of the present disclosure, the first repair signal E_HPPR will hereinafter be referred to as an even repair signal, and the second repair signal O_HPPR will hereinafter be referred to as an odd repair signal.

The repair signal generator 140 may include an even fuse information detector 141 for detecting even fuse information (e.g., an even number) and an odd fuse information detector 142 for detecting odd fuse information (e.g., an odd number). The even fuse information detector 141 may select the even clock signal E_CLK while the HPPR enable signal HPPR_EN is enabled, and may output the even repair signal E_HPPR. The odd fuse information detector 142 may select the odd clock signal O_CLK while the HPPR enable signal HPPR_EN is enabled, and may output the odd repair signal O_HPPR.

The output circuit 150 may detect available fuses, which remain unused in the respective fuse regions, to output a first output signal E_OUT or a second output signal O_OUT. For convenience of description and better understanding of the present disclosure, the first output signal E_OUT will hereinafter be referred to as an even output signal, and the second output signal O_OUT will hereinafter be referred to as an odd output signal. The output circuit 150 may include an even fuse information output circuit 151 and an odd fuse information output circuit 152.

The even fuse information output circuit 151 may detect address information of the available fuses in the even fuse region in response to the even repair signal E_HPPR, and may then output the even signal E_OUT. The odd fuse information output circuit 152 may detect address information of the available fuses in the odd fuse region in response to the odd repair signal O_HPPR, and may output the odd signal O_OUT.

As described above, the repair device 100 may output the even signal E_OUT and the odd signal O_OUT according to locations of the available fuses in the fuse region. A semiconductor memory device (referring to FIG. 7) may identify resource information of the fuse region for repair in the repair device 100. When the output circuit 150 outputs information regarding the available fuses, the repair device 100 may prevent repeated rupture operations, which is performed irrespective of the available fuses.

The failed region detection circuit 160 may locate a repair target memory cell according to the failed address FADD, and may thus output the even signal E_SIG and the odd signal O_SIG. That is, the failed region detection circuit 160 may identify a failed memory region having the repair target memory cell among a plurality of memory regions based on the failed address FADD. If the plurality of memory regions are upper and lower memory regions and a failed memory region is the upper memory region, the failed region detection circuit 160 may enable the even signal E_SIG corresponding to the upper memory region having the repair target memory cell. If a failed memory region is the lower memory region between the upper and lower memory regions, the failed region detection circuit 160 may enable the odd signal O_SIG corresponding to the lower memory region having the repair target memory cell.

For example, the failed region detection circuit 160 may detect a logic level of a specific bit of the failed address FADD, and may thus locate a failed region among the memory regions. The specific bit of the failed address FADD may indicate a specific memory region (i.e., the failed memory region) among the memory regions.

For example, if the specific bit of the failed address FADD is at a logic high level, the failed region detection circuit 160 may identify the upper memory region as the failed memory region, and may thus enable the even signal E_SIG corresponding to the upper memory region having the repair target memory cell. In another example, if the specific bit of the failed address FADD is at a logic low level, the failed region detection circuit 160 may identify the lower memory region as the failed memory region, and may thus enable the odd signal O_SIG corresponding to the lower memory region having the repair target memory cell.

The fuse region selection circuit 170 may select a sub fuse region among the plurality of sub fuse regions of the fuse region allocated for the repair operation based on the failed address FADD, the even repair signal E_HPPR, and the odd repair signal O_HPPR, and may output a repair command signal RCMD for the repair operation by using the selected sub fuse region of the fuse region.

The selected sub fuse region may correspond to a failed memory region having the repair target memory cell among a plurality of memory regions. For example, when the plurality of memory regions are upper and lower memory regions and the plurality of sub fuse regions of the fuse region are even and odd fuse regions, the upper and lower memory regions may correspond to the even and odd fuse regions, respectively.

When a failed memory region is the upper memory region, the fuse selection circuit 130 may select the even fuse region and output a repair command signal RCMD for the repair operation to the failed upper memory region by using the selected even fuse region in response to the failed address FADD and the even repair signal E_HPPR. When a failed memory region is the lower memory region, the fuse selection circuit 130 may select the odd fuse region and output a repair command signal RCMD for the repair operation to the failed lower memory region by using the selected odd fuse region in response to the failed address FADD and the odd repair signal E_HPPR.

The fuse array 180 may include a plurality of fuses allocated for the repair operation. The fuse array 180 may output a post package repair signal PPR needed to perform the repair operation in response to a repair command signal RCMD. The fuse array 180 may output to the clock generator 120 the fuse signal F_SIG indicating fuses in use in the fuse array 180.

The fuse array 180 may store a repair target address corresponding to the repair target memory cell through a fuse rupture operation. The fuse array 180 may include a plurality of fuses formed in an array, and may generate the PPR signal PPR and the fuse signal F_SIG based on the repair target address stored therein.

Figure 2:
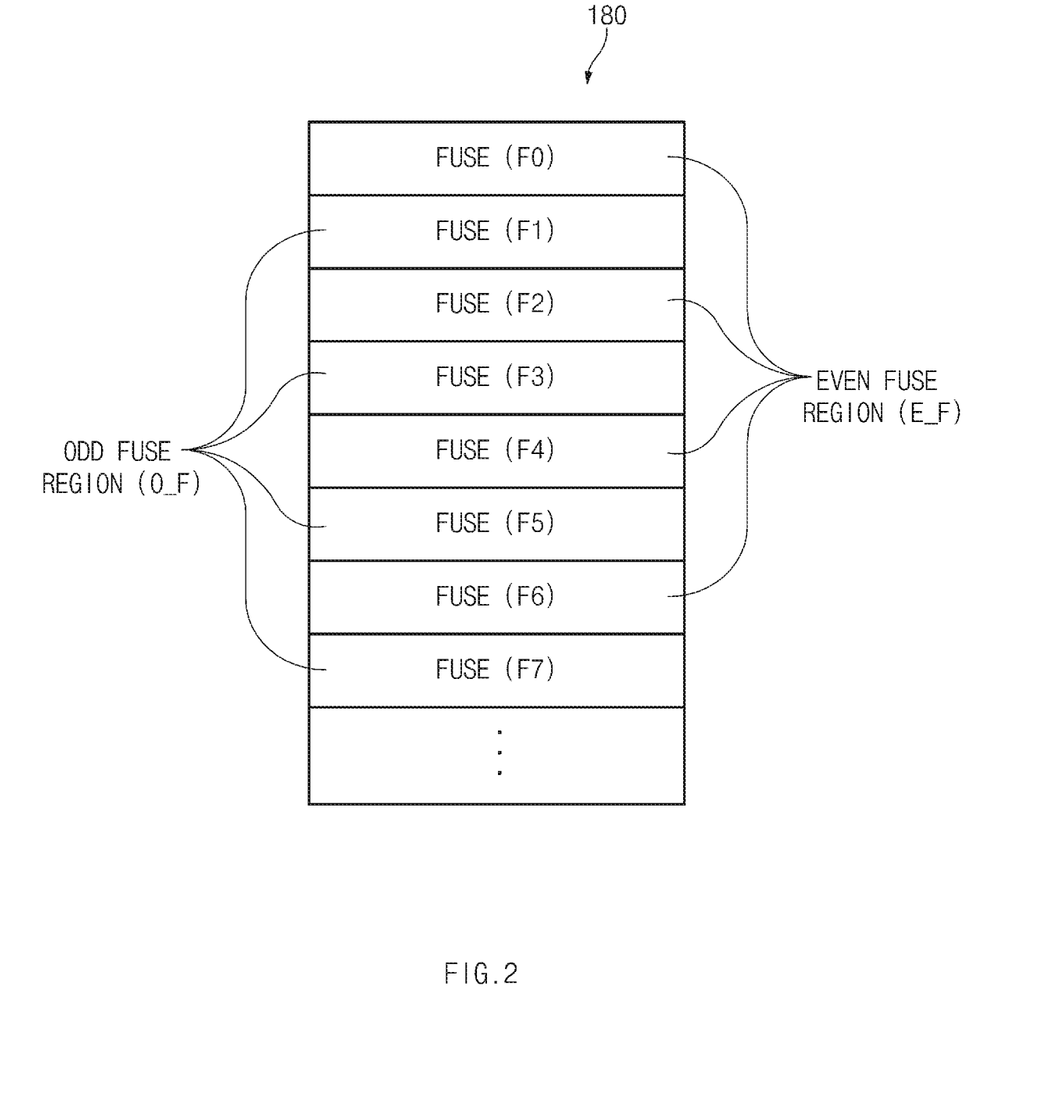
FIG. 2 is a detailed diagram illustrating a fuse array shown in FIG. 1.

FIG. 2 is a detailed diagram illustrating the fuse array 180.

Referring to FIG. 2, the fuse array 180 may include a plurality of fuses F0 to F7 allocated for a hard-post package repair (HPPR) mode. In this case, the plurality of fuses F0 to F7 may store repair target addresses therein in a package state after fabrication of the semiconductor memory device.

It is assumed that the plurality of fuses F0 to F7 may be sequentially activated in an ascending order from the first fuse F0 to the last fuse F7. However, the plurality of fuses F0 to F7 may also be sequentially activated in a descending order from the last fuse F7 to the first fuse F0.

Among the plurality of fuses F0 to F7, even fuses F0, F2, F4 and F6 arranged at even lines may be included in an even fuse region E_F. The remaining odd fuses F1, F3, F5 and F7 arranged at odd lines may be included in an odd fuse region O_F.

If the semiconductor memory device receives a command needed to perform the repair operation from the external part, the HPPR operation is carried out. The command for performing the repair operation may be supplied from an external processor or a memory controller to the semiconductor memory device. If the semiconductor memory device enters the HPPR mode, the semiconductor memory device may perform the HPPR operation for storing a repair target address in the plurality of fuses F0 to F7 of the fuse array 180.

Figure 3:
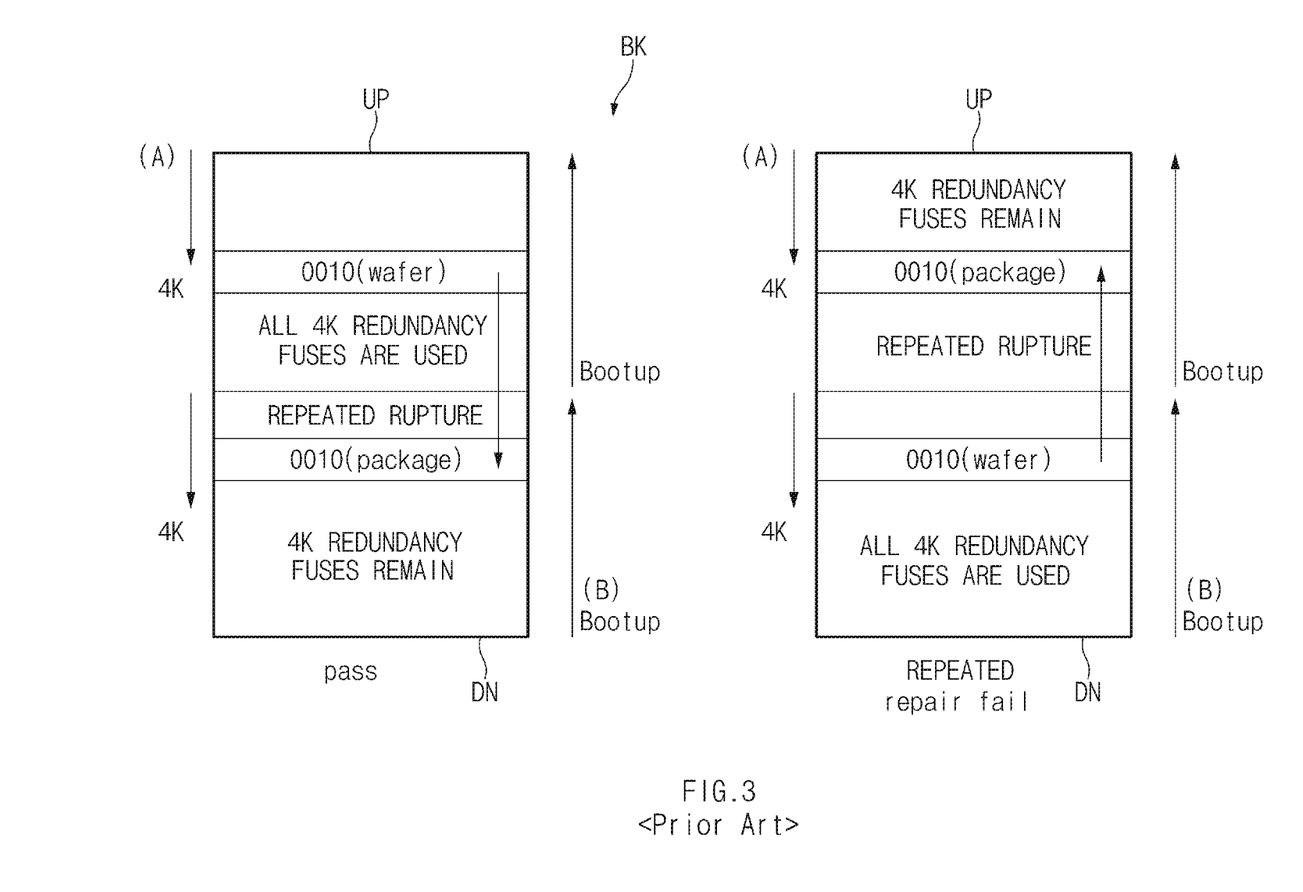
FIG. 3 is a conceptual diagram illustrating an operation of a conventional repair device.

FIG. 3 is a conceptual diagram illustrating operations of a conventional repair device.

Referring to FIG. 3, in order to improve refresh characteristics of the semiconductor memory device, a bank BK may be divided into an upper memory region UP and a lower memory region DN. If necessary, a word line of the upper memory region UP and a word line of the lower memory region DN may be simultaneously enabled to perform the refresh operation. However, a conventional fuse region may be allocated for a refresh operation of activating a single word line at a time. Therefore, when a conventional fuse allocation method is used during a refresh operation (e.g., 4K refresh operation) of activating a multi-word line at a time, fuses may operate abnormally.

For example, the direction in which the fuses allocated to the bank BK are used in the repair operation may be denoted by "A". The direction in which each of fuse in the bank BK is booted up may be denoted by "B". It is assumed that a failed address having a failed part in the bank BK may be denoted by "0010".

If a failed part occurs in the upper memory region UP of the bank BK, a normal cell of the upper memory region UP for repairing the failed address needs to be replaced with a redundancy cell. If all redundancy fuses of the upper memory region UP are used in a wafer test level, repeated rupture may be carried out in a package test level using the remaining redundancy fuses of the lower memory region DN. Since unused redundancy fuses remain in the lower memory region DN, the repeated rupture is performed in the fuse use direction A during the repair operation, such that a malfunction may not occur in the repair operation.

In contrast, if a failed part occurs in the lower memory region DN of the bank BK, a normal cell of the lower memory region DN needs to be replaced with a redundancy cell so as to repair the failed address. When all redundancy fuses of the lower memory region DN are used, the repeated rupture may be carried out using the remaining redundancy fuses of the upper memory region DN. When the repeated rupture operation is carried out in a package state, the PPR mode having priority may use the fuses. However, when the fuses are used in the boot-up direction B during the repeated rupture operation, the boot-up order is not matched to the rupture order, resulting in occurrence of a repair failure.

Figure 4:
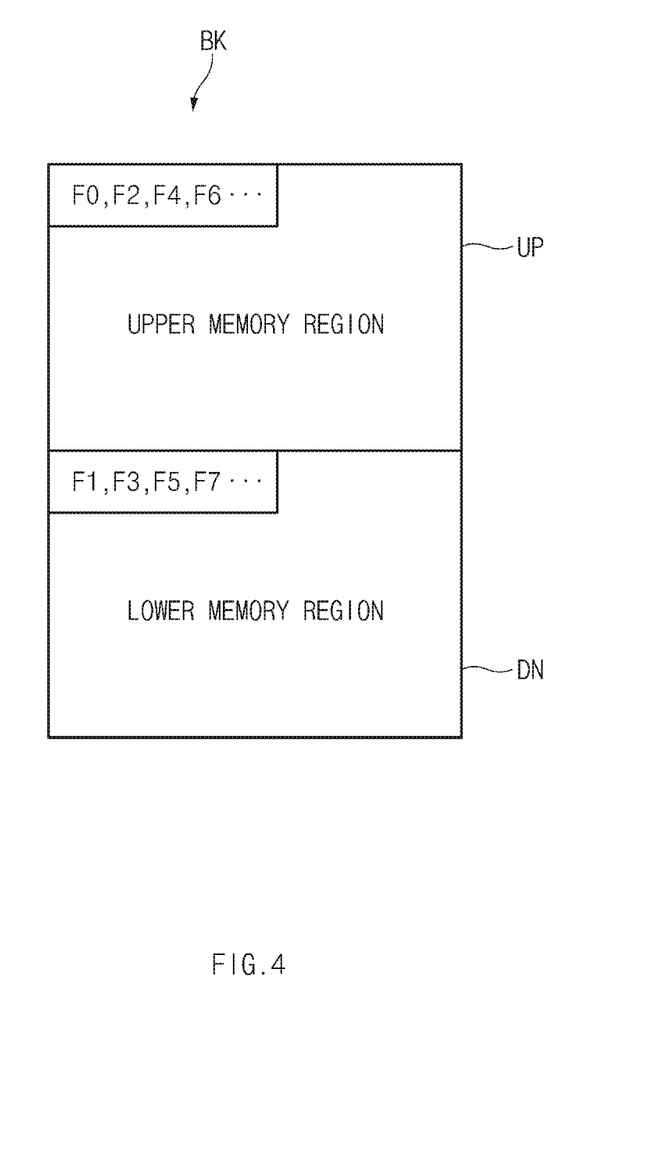
FIG. 4 is a conceptual diagram illustrating an operation of the repair device shown in FIG. 1.

FIG. 4 is a conceptual diagram illustrating an operation of the repair device 100 according to an embodiment of the present disclosure.

As shown in FIG. 4, first fuses (e.g., even repair fuses F0, F2, F4, and F6) may be arranged in the upper memory region UP of the bank BK, and second fuses (e.g., odd repair fuses F1, F3, F5, and F7) may be arranged in the lower memory region DN of the bank BK. If a failure of a memory cell occurs in the upper memory region UP, the repair operation may be carried out using the even repair fuses F0, F2, F4, and F6. If failure of a memory cell occurs in the lower memory region DN, the repair operation may be carried out using the odd repair fuses F1, F3, F5, and F7. As a result, the fuse use direction and the boot-up direction between the upper memory region UP and the lower memory region DN need not be considered, resulting in prevention of a repair failure. The embodiment of the present disclosure has exemplarily disclosed that the even repair fuses F0, F2, F4, and F6 are arranged in the upper memory region UP and the odd repair fuses F1, F3, F5, and F7 are arranged in the lower memory region DN. However, the scope or spirit of the present disclosure is not limited thereto, and the repair fuses F0 to F3 of the first group may be sequentially arranged in the upper memory region UP, while the repair fuses F4 to F7 of the second group may be sequentially arranged in the lower memory region DN.

If the repair fuses of the bank BK are arranged as shown in FIG. 4, the respective fuses of the fuse array 180 are classified into the even fuse region E_F and the odd fuse region O_F as shown in FIG. 2.

Therefore, when the even clock signal E_CLK is enabled, the even fuse region E_F may be selected in response to the even repair signal E_HPPR. In contrast, when the odd clock signal O_CLK is enabled, the odd fuse region O_F may be selected in response to the odd repair signal O_HPPR.

As described above, according to the embodiments of the present disclosure, when several word lines are simultaneously activated in the refresh operation during the HPPR mode, the mode selection signal SEL may be enabled to a logic high level. As a result, since the fuse region is divided into the even region and the odd region, the fuse regions may correspond to the memory cell regions of the bank, such that the fuses may normally operate If the embodiment of the present disclosure performs the 8K refresh operation, the mode selection signal SEL is at a logic low level. As a result, during the repair operation, the even repair fuses F0, F2, F4, and F6 of the upper memory region UP and the odd repair fuses F1, F3, F5, and F7 of the lower memory region DN may be alternately used, resulting in a sequential usage order of the fuses (e.g., a sequentially ascending usage order from the fuse F0 to the fuse F7) in the entire fuse array 180 for the repair operation. In this case, the repair device 100 may generate the repair command signal RCMD by combining the even repair signal E_HPPR and the odd repair signal O_HPPR. That is, the repair device 100 may alternately select the even repair signal E_HPPR and the odd repair signal O_HPPR in response to the fuse clock signal FCLK, such that the repair device 100 can perform the repair operation of the entire region.

Figure 5:
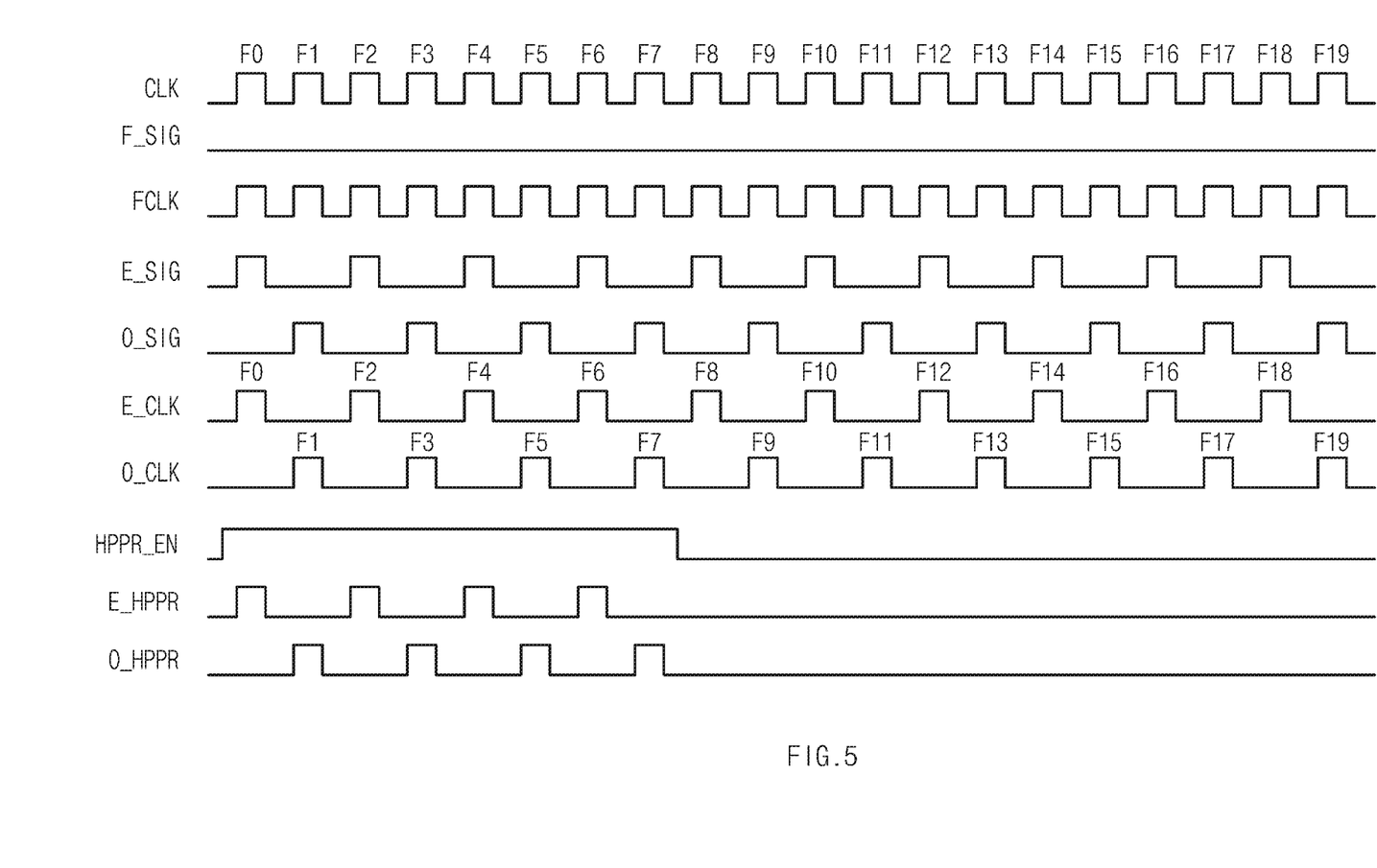
FIG. 5 is a waveform diagram illustrating an operation of the repair device shown in FIG. 1.

FIG. 5 is a waveform diagram illustrating an operation of the repair device 100.

Referring to FIG. 5, the fuse controller 110 may generate a clock signal CLK periodically enabled when the boot-up signal BOOTUP is enabled. If the number of fuses is 20, the 20 fuses F0 to F19 may correspond to a particular logic level (e.g., a logic high level as shown in FIG. 5) of the clock signal CLK.

The fuse array 180 may output the fuse signal F_SIG to the clock generator 120 to indicate fuses in use in the fuse array 180. The embodiment of the present disclosure may assume that no fuse in the fuse array 180 is in use. As a result, the fuse array 180 may output a fuse signal F_SIG at a logic low level without any toggle.

If the clock generator 120 receives the fuse signal F_SIG having a logic low level, the clock generator 120 may generate a fuse clock signal FCLK synchronized with the clock signal CLK. The fuse signal F_SIG of a logic high level may represent a corresponding fuse in use in the fuse array 180. As described above, toggles of the fuse signal F_SIG may represent corresponding fuses in use in the fuse array 180. When the fuse signal F_SIG toggles to a logic high level, which represents a corresponding fuse in use, the clock generator 120 may not generate the fuse clock signal FCLK.

The fuse selection circuit 130 may generate the even clock signal E_CLK synchronized with each even clock of the fuse clock signal FCLK while the even signal E_SIG is enabled. In other words, whenever the even signal E_SIG toggles to a logic high level, the fuse selection circuit 130 may detect the even fuse region E_F in synchronization with each even clock of the fuse clock signal FCLK.

Accordingly, among the plurality of fuses F0 to F7, only the even fuses of the even fuse region E_F corresponding to the even clock of the fuse clock signal FCLK may be used. If failure of a memory cell occurs in the upper memory region UP corresponding to the even fuse region E_F during the HPPR operation, only the even fuses F0, F2, F4, and F6 may be used.

The fuse selection circuit 130 may generate the odd clock O_CLK synchronized with each odd clock of the fuse clock signal FCLK while the odd signal O_SIG is enabled. For example, whenever the odd signal O_SIG toggles to a logic high level, the fuse selection circuit 130 may detect the odd fuse region O_F in synchronization with each odd clock of the fuse clock signal FCLK.

Accordingly, among the plurality of fuses F0 to F7, only the odd fuses of the odd fuse region O_F corresponding to the odd clock of the fuse clock signal FCLK may be used. If failure of a memory cell occurs in the lower memory region DN corresponding to the odd fuse region O_F during the HPPR operation, only the odd fuses F1, F3, F5, and F7 may be used.

While the HPPR enable signal HPPR_EN is enabled, the repair signal generator 140 may output the even repair signal E_HPPR, or may output the odd repair signal O_HPPR. In more detail, the even fuse information detector 141 may output the even repair signal E_HPPR synchronized with the even clock signal E_CLK while the HPPR enable signal HPPR_EN is enabled to a logic high level. In contrast, the odd fuse information detector 142 may output the odd repair signal O_HPPR synchronized with the odd clock signal O_CLK while the HPPR enable signal HPPR_EN is enabled to a logic high level.

It is assumed that the number of fuses for the HPPR mode is set to 8 as shown in FIG. 5, which exemplifies the HPPR enable signal HPPR_EN remaining enabled to a logic high level as long as first eight toggles of the clock signal CLK respectively corresponding to eight fuses F0 to F7 in FIG. 5. After the clock signal CLK toggles to a logic high level eight times, the HPPR enable signal HPPR_EN may remain at a logic low level.

Thereafter, the output circuit 150 may individually detect available fuses of the even fuse region E_F and the odd fuse region O_F, and may output the even signal E_OUT and the odd signal O_OUT representing the detected available fuses. For example, the output circuit 150 may convert the even signal E_OUT and the odd signal O_OUT into binary numbers, and may thus indicate address information of the remaining fuses using the binary numbers.

The even fuse information output circuit 151 may detect the even repair signal E_HPPR, and may output the even signal E_OUT representing the available fuses in the even fuse region E_F. For example, the even fuse information output circuit 151 may detect individual toggles of the even repair signal E_HPPR respectively corresponding to available fuses among the fuses F0, F2, F4, and F6, and may output a bitmap-typed signal representing the detected toggles of the even repair signal E_HPPR as the even signal E_OUT.

As described above, the 20 fuses F0 to F19 may correspond to toggles of the clock signal CLK, respectively. Further, the clock generator 120 may detect an available fuse based on the fuse signal F_SIG, toggles of which respectively represent corresponding fuses in use in the fuse array 180, and may thus generate the fuse clock signal FCLK indicating the individual available fuses. Therefore, the toggles of the even repair signal E_HPPR may respectively represent the corresponding available fuses among the even fuses F0, F2, F4, and F6 in the even fuse region E_F.

Similarly, the odd fuse information output circuit 152 may detect the odd repair signal O_HPPR, and may output the odd signal O_OUT representing the individual available fuses in the odd fuse region O_F. For example, the odd fuse information output circuit 152 may detect individual toggles of the odd repair signal O_HPPR respectively corresponding to available fuses among the fuses F1, F3, F5, and F7, and may output the counted number of clocks as a binary number, and may output a bitmap-typed signal representing the detected toggles of the odd repair signal O_HPPR as the odd signal O_OUT.

As described above, the toggles of the odd repair signal O_HPPR may respectively represent the corresponding available fuses among the odd fuses F1, F3, F5, and F7 in the odd fuse region O_F.

Figure 6:
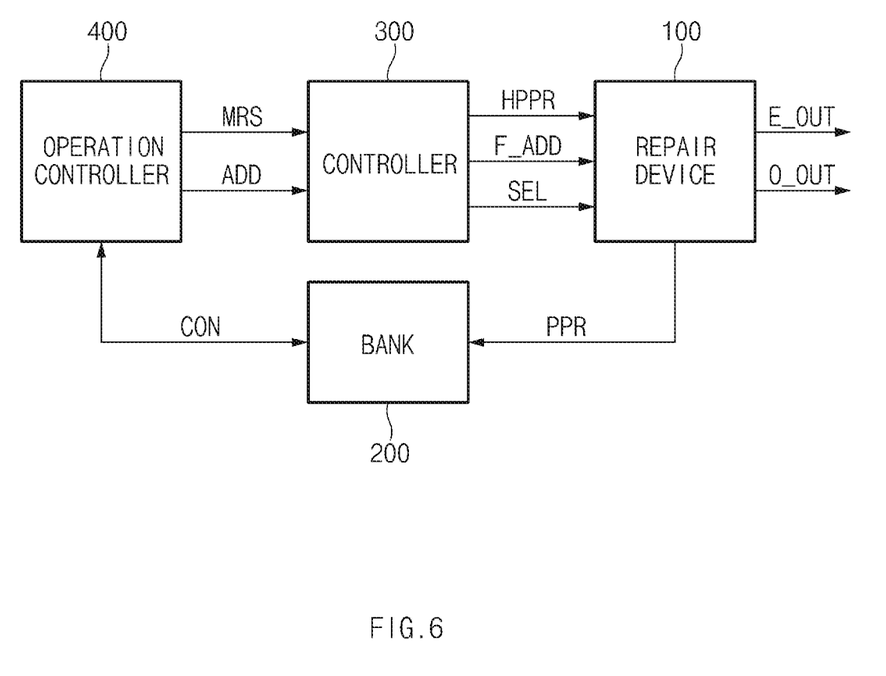
FIG. 6 is a block diagram illustrating a memory system including the repair device according to an embodiment of the present disclosure.

FIG. 6 is a block diagram illustrating a memory system including the repair device according to an embodiment of the present disclosure.

Referring to FIG. 6, the memory system may include the repair device 100 described with reference to FIGS. 1 to 5, a bank 200, a controller 300, and an operation controller 400.

The bank 200 may correspond to the semiconductor memory device including a cell array in which cell data is read or written. The bank 200 may perform the repair operation upon receiving the PPR signal from the repair device 100.

The controller 300 may output the HPPR signal HPPR, the input address F_ADD, and the mode selection signal SEL to the repair device 100, upon receiving the mode register set signal MRS and the address ADD. The input address F_ADD may include a failed bank address and failed address information.

The operation controller 400 may generate the mode register set signal MRS and the address ADD, and may output the mode register set signal MRS and the address ADD to the controller 300. The operation controller 400 may generate a control signal CON needed to control the bank 200. The operation controller 400 may also change the MRS signal MRS and the address ADD upon receiving the output signal from the bank 200. In this case, the operation controller 400 may be a unified control device for controlling all the operations of the controller 300 and the bank 200, and may correspond to a chipset.

Figure 7:
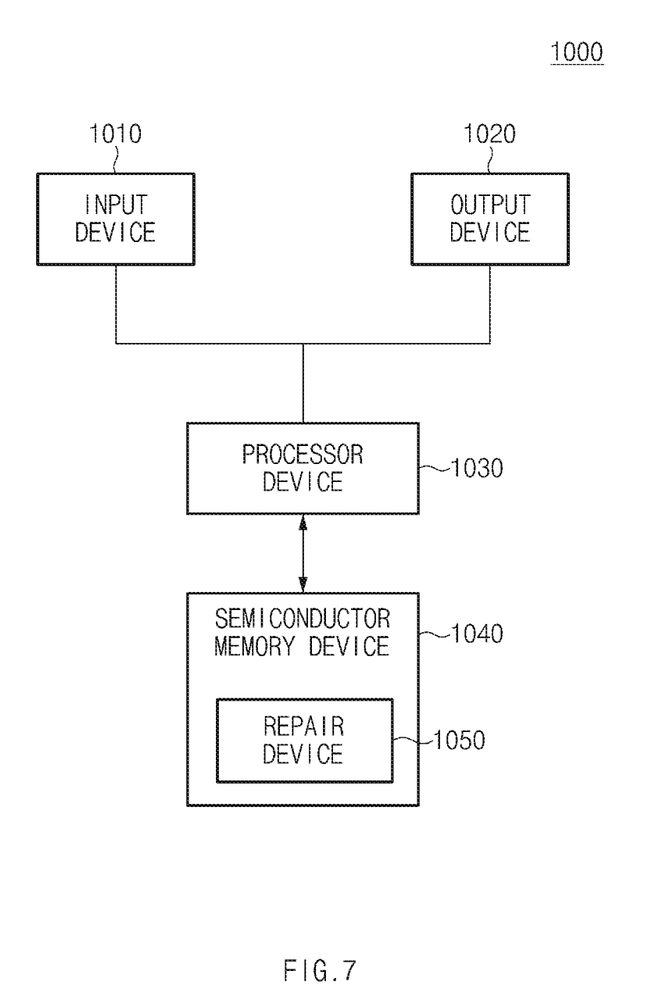
FIG. 7 is a block diagram illustrating an application of an electronic system including the repair device according to an embodiment of the present disclosure.

FIG. 7 is a block diagram illustrating an application of an electronic system including the repair device according to an embodiment of the present disclosure.

Referring to FIG. 7, the electronic system 1000 may include an input device 1010, an output device 1020, a processor device 1030, and a semiconductor memory device 1040. In this case, the processor device 1030 may control the input device 1010, the output device 1020, and the semiconductor memory device 1040 through the corresponding interfaces.

The processor device 1030 may include a microprocessor, a digital signal processor, a microcontroller, and logic circuits capable of performing the same or similar functions as these components.

The input device 1010 may include a keyboard, a mouse, a keypad, a touchscreen, a scanner, and so forth. The output device 1020 may include a monitor, a speaker, a printer, a display device, and so forth. The semiconductor memory device 1040 may include a repair device 1050 described in the aforementioned embodiments.

Figure 8:
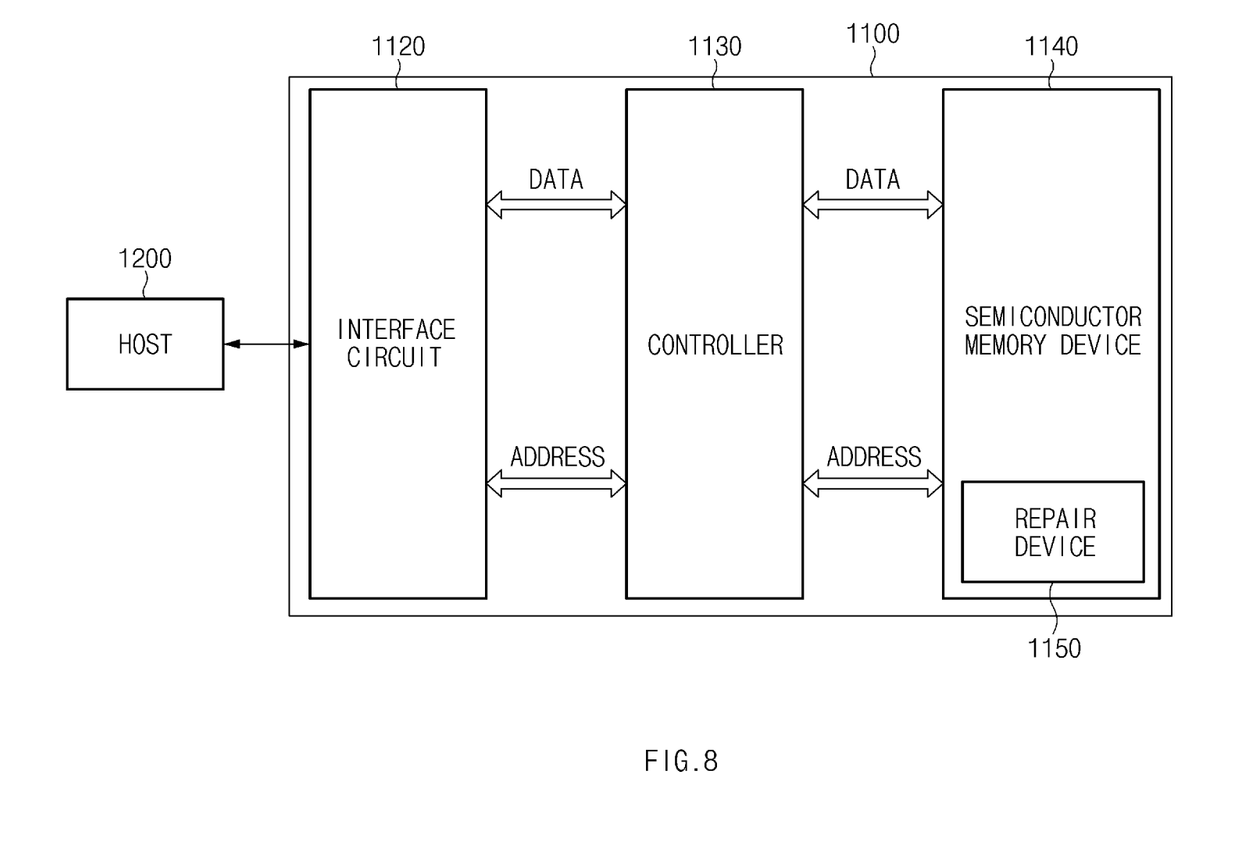
FIG. 8 is a block diagram illustrating a memory system based on a semiconductor memory device according to an embodiment of the present disclosure.

FIG. 8 is a block diagram illustrating a memory system using a semiconductor memory device according to the embodiment of the present disclosure.

Referring to FIG. 8, the memory system 1100 may include a semiconductor memory device 1140, an interface circuit 1120, and a controller 1130.

The interface circuit 1120 may provide interfacing between the memory system 1110 and the host 1200. The interface unit 1120 may include a data exchange protocol corresponding to the host 1200 to interface with the host 1200.

The interface circuit 1120 may communicate with the host 1200 through one of various interface protocols, for example, a Universal Serial Bus (USB) protocol, a Multimedia Card (MMC) protocol, a Peripheral Component Interconnect-Express (PCI-E) protocol, a Serial Attached SCSI (SAS) protocol, a Serial Advanced Technology Attachment (SATA) protocol, a Parallel Advanced Technology Attachment (PATA) protocol, a Small Computer System Interface (SCSI) protocol, an Enhanced Small Disk Interface (ESDI), and an Integrated Drive Electronics (IDE) protocol.

The controller 1130 may receive data and address from an external part through the interface circuit 1120. The controller 1130 may access the semiconductor device 1140 by referring to data and address received from the host 1200. The controller 1130 may transfer data read from the semiconductor memory device 1140 to the host 1200 through the interface circuit 1120.

The semiconductor memory device 1140 may include a repair device 1150 illustrated in FIG. 1. The semiconductor memory device 1140 may be used as a storage medium of the memory system 1100.

The memory system 1100 illustrated in FIG. 8 may be mounted to information processing devices, for example, a personal digital assistant (PDA), a portable computer, a web tablet, a digital camera, a portable media player (PMP), a mobile phone, a wireless phone, a laptop computer, etc. The memory system 1100 may be any of a multimedia card (MMC), a Secure Digital (SD) card, a micro SD card, a memory stick, an ID card, a Personal Computer Memory Card International Association (PCMCIA) card, a chip card, a USB card, a smart card, a Compact Flash (CF) Card, etc.

As is apparent from the above description, the repair device and the semiconductor device including the same according to the embodiments of the present disclosure may divisionally use a fuse region and may output information regarding available fuses during a post package repair (PPR) process such that the available fuses can normally operate during the PPR process.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A repair device comprising:
a clock generator configured to generate a fuse clock signal corresponding to an available fuse based on a fuse signal indicating whether a fuse is used or not;
a fuse selection circuit configured to discriminate between a first clock signal and a second clock signal in the fuse clock signal in response to a first signal and a second signal;
a repair signal generator configured to output a first repair signal corresponding to the first clock signal and a second repair signal corresponding to the second clock signal during a post package repair (PPR) mode; and
an output circuit configured to output a first output signal by detecting address information of remaining unused fuses in response to the first repair signal, or configured to output a second output signal by detecting address information of remaining unused fuses in response to the second repair signal.

2. The repair device according to claim 1, wherein the post package repair PPR mode is a hard post package repair (HPPR) mode.

3. The repair device according to claim 1, wherein the clock generator generates the fuse clock signal, which toggles while the fuse signal has a first logic value, from a periodically toggling clock signal.

4. The repair device according to claim 1, further comprising:

a fuse controller configured to generate a clock signal periodically enabled in response to a boot-up signal, and output a post package repair (PPR) enable signal in response to a post package repair (PPR) signal, a failed address, and a mode selection signal;

a failed region detection circuit configured to determine a position of a failed region in response to the failed address, and selectively activate the first signal and the second signal;

a fuse region selection circuit configured to output a repair command signal for repairing the failed region in response to the failed address, the first repair signal, and the second repair signal; and a fuse array configured to include a plurality of fuses allocated to the post package repair (PPR) mode, and perform a repair operation in response to the repair command signal.

5. The repair device according to claim 4, wherein the fuse array is configured to generate the fuse signal indicating whether the plurality of fuses is used.

6. The repair device according to claim 4, wherein the fuse array is divided into a fuse region of a first group and a fuse region of a second group.

7. The repair device according to claim 4, wherein the fuse array is divided into an even fuse region arranged in even lines and an odd fuse region arranged in odd lines.

8. The repair device according to claim 4, wherein the plurality of fuses are sequentially activated in one of ascending and descending order.

9. The repair device according to claim 1, wherein:
while the first signal has a first logic level, the fuse selection circuit generates the first clock signal from even toggles of the fuse clock signal; and
while the second signal has a first logic level, the fuse selection circuit generates the second clock signal from odd toggles of the fuse clock signal.

10. The repair device according to claim 1, wherein the repair signal generator includes:
a first fuse information detector configured to output the first repair signal synchronized with the first clock signal during a hard-post package repair (HPPR) mode; and
a second fuse information detector configured to output the second repair signal synchronized with the second clock signal during the hard—post package repair (HPPR) mode.

11. The repair device according to claim 1,
wherein the repair signal generator outputs the first and second repair signals in the PPR mode, and
wherein the PPR mode is activated while periodically toggling clock toggles N times when a fuse array has N number of fuses for a repair operation in the PPR mode.

12. The repair device according to claim 1, wherein the output circuit includes:
a first fuse information output circuit configured to detect individual toggles of the first repair signal respectively corresponding to available ones in a first fuse group, and output the first output signal representing the available fuse in the first fuse group; and
a second fuse information output circuit configured to detect individual toggles of the second repair signal respectively corresponding to available ones in a second fuse group, and output the second output signal representing the available fuse in the second fuse group.

13. The repair device according to claim 12, wherein the first and second output signals are of bitmap-typed signals representing the available fuse in the first and second fuse groups, respectively.

14. A semiconductor memory device comprising:
a bank divided into a first memory region having even repair fuses and a second memory region having odd repair fuses; and
a repair device including a fuse array including first and second fuse groups, which respectively correspond to the first and second memory regions, and configured to control the bank to perform a repair operation alternately to the first and second memory regions by using the fuse array in a post package repair (PPR) mode,
wherein a repair operation on the first memory region is performed using the even repair fuses, and a repair operation on the second memory region is performed using the odd repair fuses.

15. The semiconductor memory device according to claim 14,
wherein the fuse array generates a fuse signal, and
wherein the repair device includes:
a clock generator configured to generate a fuse clock signal, each toggle of which corresponds to an available fuse in the fuse array, based on the fuse signal;
a failed region detection circuit configured to generate first and second signals respectively indicating the first and second memory regions according to a failed address of a repair target memory cell in the bank;
a fuse selection circuit configured to generate first and second clock signals, which respectively correspond to the first and second fuse groups, from the fuse clock signal in response to the first and second signal;
a repair signal generator configured to output first and second repair signals from the first and second clock signals, respectively; and
an output circuit configured to detect the available fuse in the respective first and second fuse groups, and output first and second output signals according to the first and second repair signals.

16. The semiconductor memory device according to claim 15, wherein the repair device further includes a fuse region selection circuit configured to output a repair command signal to the fuse array for repairing the repair target memory cell in response to the failed address and the first and second repair signals.

17. The semiconductor memory device according to claim 16, wherein the first fuse group includes a plurality of fuses arranged in even lines, and the second fuse group includes a plurality of fuses arranged in odd lines.

18. The semiconductor memory device according to claim 14, wherein the post package repair PPR mode is a hard—post package repair (HPPR) mode.

19. A repair device comprising:
a fuse array including first and second fuse groups for a repair operation in a post package repair (PPR) mode, and configured to generate a fuse signal;
a clock generator configured to generate a fuse clock signal, each toggle of which corresponds to an available fuse in the fuse array, based on the fuse signal;
a failed region detection circuit configured to generate first and second signals respectively indicating first and second memory cell regions of a memory cell array according to a failed address of a repair target memory cell in the memory cell array;
a fuse selection circuit configured to generate first and second clock signals, which respectively correspond to the first and second fuse groups, from the fuse clock signal in response to the first and second signal;
a repair signal generator configured to output first and second repair signals from the first and second clock signals, respectively; and
an output circuit configured to detect the available fuse in the respective first and second fuse groups, and output first and second output signals according to the first and second repair signals.

20. The repair device according to claim 19, further comprising a fuse region selection circuit configured to output a repair command signal to the fuse array for repairing the repair target memory cell in response to the failed address and the first and second repair signals.

* * * * *